(12) United States Patent
Sandhu et al.

(10) Patent No.: US 8,682,129 B2
(45) Date of Patent: Mar. 25, 2014

(54) PHOTONIC DEVICE AND METHODS OF FORMATION

(75) Inventors: Gurtej Sandhu, Boise, ID (US); Roy Meade, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 127 days.

(21) Appl. No.: 13/354,767

(22) Filed: Jan. 20, 2012

(65) Prior Publication Data

US 2013/0188903 A1   Jul. 25, 2013

(51) Int. Cl.
*G02B 6/10*   (2006.01)

(52) U.S. Cl.
USPC .......................................................... 385/132

(58) Field of Classification Search
USPC .................................................. 385/129, 132
See application file for complete search history.

(56) References Cited

U.S. PATENT DOCUMENTS

| | | | |
|---|---|---|---|
| 5,682,401 A * | 10/1997 | Joannopoulos et al. | 385/129 |
| 5,684,817 A * | 11/1997 | Houdre et al. | 372/45.01 |
| 6,115,514 A | 9/2000 | Ando et al. | |
| 6,711,200 B1 * | 3/2004 | Scherer et al. | 372/64 |
| 7,054,532 B2 | 5/2006 | Forbes et al. | |
| 7,084,058 B2 | 8/2006 | Ahn et al. | |
| 7,118,682 B2 | 10/2006 | Patel et al. | |
| 7,167,606 B2 | 1/2007 | Gunn, III et al. | |
| 7,262,140 B2 | 8/2007 | Brask et al. | |
| 7,298,949 B2 | 11/2007 | Gothoskar et al. | |
| 7,333,703 B2 * | 2/2008 | Hatsuda et al. | 385/129 |
| 7,390,683 B2 * | 6/2008 | Sugitatsu et al. | 438/22 |
| 7,418,161 B2 | 8/2008 | Mouli | |
| 7,529,460 B2 | 5/2009 | Forbes et al. | |
| 7,532,777 B2 * | 5/2009 | Mitomi et al. | 385/2 |
| 7,546,017 B2 * | 6/2009 | Siga et al. | 385/131 |
| 7,688,378 B2 | 3/2010 | Mouli | |
| 7,831,123 B2 | 11/2010 | Sparacin et al. | |
| 7,858,458 B2 | 12/2010 | Mathew | |

(Continued)

FOREIGN PATENT DOCUMENTS

| | | |
|---|---|---|
| GB | 2 343 964 A | 5/2000 |
| WO | WO 2010/035568 A1 | 4/2010 |

OTHER PUBLICATIONS

Jiang, Yongqiang, et al., :80-micron interaction length silicon photonic crystal waveguide modulator, Microelectronic Research Center, Applied Physics Letter 87, Nov. 22, 2005.

(Continued)

*Primary Examiner* — Charlie Peng
(74) *Attorney, Agent, or Firm* — Dickstein Shapiro LLP

(57) ABSTRACT

A photonic device and methods of formation that provide an area providing reduced optical coupling between a substrate and an inner core of the photonic device are described. The area is formed using holes in the inner core and an outer cladding. The holes may be filled with materials which provide a photonic crystal. Thus, the photonic device may function as a waveguide and as a photonic crystal.

39 Claims, 10 Drawing Sheets

(56) References Cited

U.S. PATENT DOCUMENTS

| | | |
|---|---|---|
| 7,929,814 B2 | 4/2011 | Gothoskar et al. |
| 8,014,643 B2 | 9/2011 | O et al. |
| 2002/0036299 A1 | 3/2002 | Young et al. |
| 2004/0156610 A1* | 8/2004 | Charlton et al. ............ 385/129 |
| 2004/0202422 A1 | 10/2004 | Gunn, III |
| 2005/0179986 A1* | 8/2005 | Gothoskar et al. ............ 359/321 |
| 2006/0034577 A1 | 2/2006 | Furuya et al. |
| 2006/0083472 A1 | 4/2006 | Sakai et al. |
| 2006/0088265 A1* | 4/2006 | Akiyama et al. ............ 385/129 |
| 2006/0147169 A1 | 7/2006 | Sugita et al. |
| 2006/0157716 A1 | 7/2006 | Sugitatsu et al. |
| 2006/0182400 A1 | 8/2006 | Furuya et al. |
| 2009/0087137 A1 | 4/2009 | Doan |
| 2009/0137078 A1 | 5/2009 | Asatsuma et al. |
| 2011/0012221 A1 | 1/2011 | Fujikata et al. |
| 2011/0013867 A1 | 1/2011 | De Los Santos |

OTHER PUBLICATIONS

Yamada, Hirohito, et al., "Si Photonic Wire Waveguide Devices", IEEE Journal of Selected Topics in Quantum Electronics, vol. 12, No. 6, Nov./Dec. 2006.

Chen, Long, et al., "Integrated GHz silicon photonic interconnect with micrometer-scale modulators and detectors", Optics Express, vol. 17, No. 17, Aug. 17, 2009.

"Optical Properties of Silicon", Virginia Semiconductor, Inc.

Taillaert, Dirk, et al., "Compact efficient broadband grating coupler for silicon-on-insulator waveguides", Optics Letters, vol. 29, No. 23, Dec. 1, 2004.

Jiao, Yang, et al., "Photonic Crystal Device Optimization Without Increasing Fabrication Tolerances: A Mode Demultiplexer Design", Optical Society of America, 2005.

Soljacic, Marin, et al., "Nonlinear photonic crystal microdevices for optical integration", Optics Letter, vol. 28, No. 8, Apr. 15, 2003.

* cited by examiner

PHOTONIC DEVICE AND METHODS OF FORMATION

FIELD OF THE INVENTION

Embodiments disclosed herein relate generally to the field of electronic devices, e.g., semiconductor devices, and more particularly to a photonic device and methods of formation.

BACKGROUND OF THE INVENTION

Electronic-photonic devices, also known as optoelectronic devices, are a class of electronic devices that are capable of sourcing, controlling, and detecting light. Electronic-photonic devices include both electronic and photonic functions. In the semiconductor industry, photonic devices have various cutting-edge applications including communication within a chip, between chips of a computer board, and between computer boards. In response to more demanding communication bandwidth, energy consumption, and performance standards for electronic devices such as semiconductor devices, photonic devices, e.g., photonic crystals, optical waveguides, are increasingly being integrated with optical/electrical circuits to form a type of electronic-photonic device called an electronic-photonic integrated circuit. In the electronic-photonic integrated circuit, the elements that perform the pure optical functions, the pure electrical functions and the optoelectronic functions may be formed concurrently, on the same or different substrate, using a CMOS process flow. The current CMOS process flow includes a series of complex fabrication steps including deposition, masking, etching and doping.

One advantageous photonic device is a photonic crystal, a material and/or lattice of structures, e.g., an arrangement of a plurality of holes, with a periodic alteration in the index of refraction. Photonic crystals have holes that allow customization of unique properties for electromagnetic wave propagation. Similar to the bandgap energy in semiconductors, where carrier energies are blocked, photonic crystals can provide a photonic bandgap for electromagnetic waves, where the presence of particular wavelengths is blocked while other wavelengths are allowed to pass through. The blocked directions are the "photonic bandgaps" of the structure. If the photonic crystal does not allow light to propagate within a wavelength range for all polarizations and directions, it has a "complete photonic bandgap." Photonic crystals include two-dimensional (2D) and three-dimensional (3D) photonic crystals. 2D photonic crystals have periodicity in two dimensions and are uniform in the third dimension. Although a 2D photonic crystal cannot have a complete bandgap, it can have a blocked gap that exists for all directions and polarizations of propagation precisely confined to a particular plane of periodicity. By contrast, in 3D photonic crystals, the dielectric lattice is periodic in three dimensions, forming a complete photonic bandgap.

Another particularly useful photonic device is an optical waveguide, i.e., an optical path, formed on a substrate. A typical optical waveguide structure includes an inner core and an outer cladding material. The inner core may be formed of a material with a greater refractive index (n) than the index of the outer cladding material. Wave guiding occurs upon internal reflection of electromagnetic waves at the interface between the higher refractive index inner core and the lower refractive index outer cladding material.

Management of the differences between the inner core refractive index and the outer cladding material refractive index is needed to maintain uninterrupted propagation of optical signals through the waveguide with minimal leakage of the optical signal. Materials with a refractive index matching the refractive index of the inner core, even if spaced from the inner core, can couple with the inner core and attract optical signals away from the waveguide through a process called evanescent coupling, disrupting the propagation of optical signals through the waveguide. In particular, electronic-photonic devices and other electronic devices with electronic and photonic functions having various optical and electrical structures integrated on the same or different substrates can be susceptible to this type of optical loss.

A photonic device that mitigates optical loss from optical coupling and can also function as a photonic crystal to achieve a photonic bandgap of a certain value would advance the performance and efficiency of electronic-photonic devices and other electronic devices, e.g., semiconductor devices.

DETAILED DESCRIPTION OF THE INVENTION

Figure 1A:
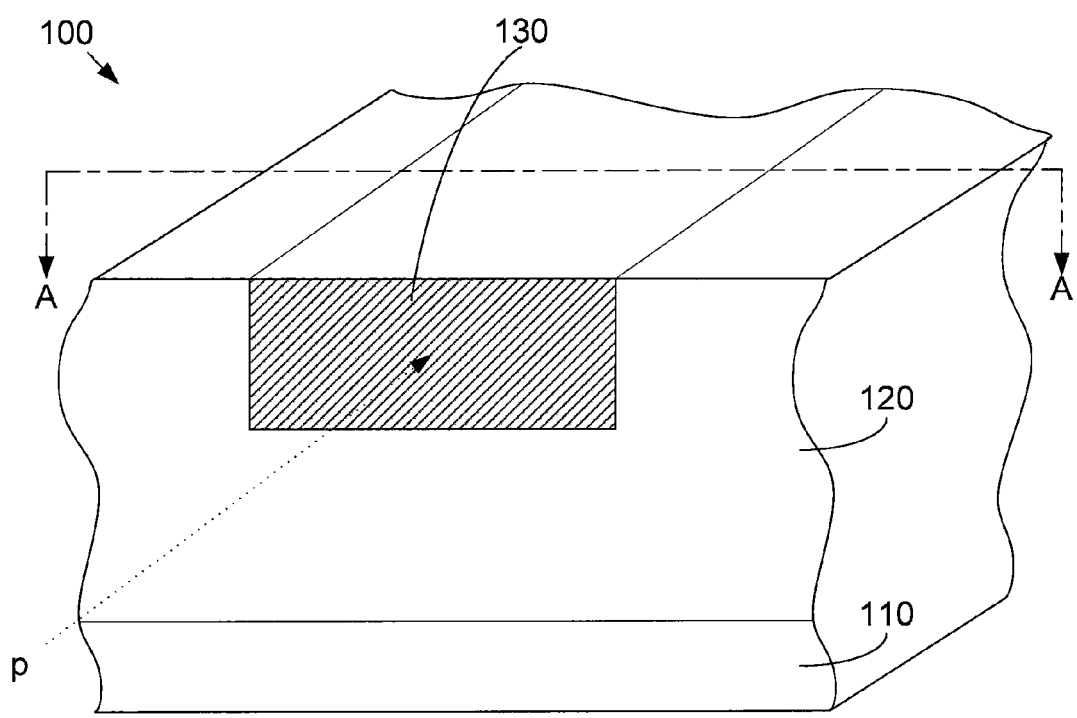
FIG. 1A is a perspective view of a photonic device according to an embodiment at an initial stage of processing.

In the following detailed description, reference is made to the accompanying drawings, which form a part hereof, and in which is shown by way of illustration specific embodiments that may be practiced. It should be understood that like reference numbers represent like elements throughout the drawings. Embodiments are described in sufficient detail to enable those skilled in the art to make and use them, and it is to be understood that structural, material, electrical, and procedural changes may be made to the specific, embodiments disclosed, only some of which are discussed in detail below.

The term "substrate" includes silicon, silicon-on-insulator (SOI), silicon-on-nothing (SON), and silicon-on-sapphire (SOS) technology, doped and undoped semiconductors, epitaxial layers of silicon supported by a base semiconductor foundation, and other semiconductor structures. Furthermore, when reference is made to a "substrate" in the following description, previous process steps may have been utilized to form regions or junctions in the base semiconductor structure or foundation, as well as insulating substrates, such as glass or quartz. The term "substrate" is also understood as including, for example, linear and non-linear optical materials, metals, semiconductors and insulators/dielectrics, acoustic materials, magnetic materials, ferroelectric materials, piezoelectric materials, and superconducting materials, among others. In addition, the semiconductor need not be silicon-based, but could be based on for example, silicon germanium (SiGe), germanium (Ge), gallium arsenide (GaAs), or indium phosphide (InP).

The term "photonic crystal" refers to a material and/or lattice of structures, e.g., an arrangement of holes, with a periodic alteration in the index of refraction. "Photonic crystal" includes 2D and 3D photonic crystals as well as single and multi-mode photonic crystals.

Embodiments described herein provide a photonic device for use in electronic devices, e.g., electronic-photonic devices, semiconductor devices, and methods of forming the same. The photonic device has at least a substrate, an inner core, an outer cladding material and an anti-coupling area of the substrate. The anti-coupling area of the substrate can extend below at least a portion of the inner core of the device and at least a portion of the cladding layer of the device. A plurality of holes can be provided in the inner core extending therethrough from a top surface thereof to assist in formation of the anti-coupling area. The plurality of holes can also be used to form a photonic crystal.

The combination of the plurality of holes and the anti-coupling area of the photonic device offers several advantages. The anti-coupling area can increase optical separation—and thus decrease coupling—between the inner core of the photonic device and the substrate on or in which it is fabricated. The anti-coupling area has a refractive index that is about equal to or less than a refractive index of the outer cladding material, e.g., silicon dioxide, aluminum oxide or other dielectric material or suitable metal oxide. Reduced coupling between the substrate and the inner core of the photonic device can limit potential propagation loss from the photonic device.

In an embodiment, at least a portion of the anti-coupling area has a refractive index that is about equal to or less than a refractive index of the outer cladding material. A plurality of holes through the inner core and cladding which may be used to form the anti-coupling area may be filled with a material having a refractive index that ensures unencumbered electromagnetic wave propagation through the inner core.

In other embodiments, in addition to the anti-coupling area, at least a first group of the plurality of holes which may be used to form the anti-coupling area may have a first refractive index that is about equal to or less than a refractive index of the outer cladding material and a second group of the plurality of holes may have a second refractive index that is also about equal to or less than a refractive index of the outer cladding material. In such embodiments, the photonic device can also function as a photonic crystal with a customizable photonic bandgap of a certain value, in addition to providing a way to form an anti-coupling area protecting against potential optical leakage due to unwanted coupling between the inner core and the substrate.

The various embodiments of the photonic device may be formed at a suitable stage of processing after a substrate is formed during an existing CMOS process flow, for example, during a damascene or dual damascene process. As described in U.S. Pat. No. 7,074,717, a damascene process flow is an electrical interconnection fabrication process in which trenches or other recesses are formed in an insulation or dielectric layer of a semiconductor device. The trenches are filled with a metal or other conductive material to form conductive structures. For its part, the dual damascene process is a multilevel interconnection fabrication process in which contact openings are also formed in an insulation or dielectric layer of a semiconductor device. The stage of CMOS or damascene processing when the photonic device processing steps (discussed below with respect to FIGS. 1A-1F) occur depends on the optical and electrical parameters of the electronic device being fabricated and where the photonic device will be formed on the substrate. The location of the photonic device is also determined by the optical and electrical parameters of the electronic device. The damascene process flow has the advantage of providing a smooth finish to a top surface of the inner core, which can contribute to reduced optical leakage from the inner core.

Figure 1B:
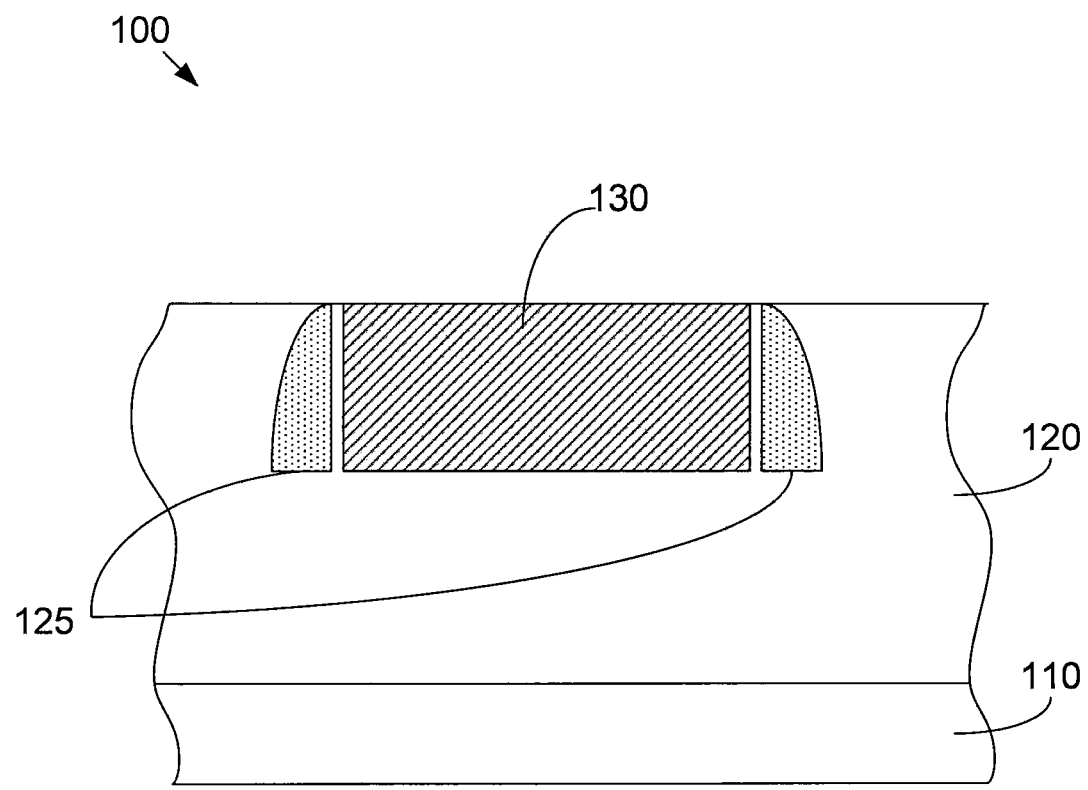
FIG. 1B is a cross-sectional view of the photonic device of FIG. 1A taken along section A-A at a stage of processing subsequent to that of FIG. 1A.

FIG. 1A illustrates a perspective view of an embodiment of a photonic device 100 at an initial stage of processing and FIG. 1B illustrates a cross-sectional view of the photonic device 100 taken along cross-section A-A. After a substrate 110 is formed by any processing step known in the art, an outer cladding material 120 and an inner core 130 may be formed sequentially by a suitable deposition technique, e.g., chemical vapor deposition, lithographic processing technique, annealing process, e.g., thermal oxidation process at between about 800° C. and about 1200° C., or other process compatible with the CMOS (or damascene) process flow. The outer cladding material 120 and inner core 130 may be formed above the substrate 110. From the A-A cross-section, the inner core 130 may have a rectangular shape (as shown in FIG. 1B) or the inner core 130 may have a spherical, polygonal or other shape. As shown in FIG. 1B, the inner core 130 may be embedded in at least a portion of the outer cladding material 120. In FIG. 1B, the outer cladding material 120 does not extend over the inner core 130, but this is not limiting. That is, the outer cladding material 120 may extend over at least a portion of the inner core 130, if desired. The inner core 130 of the photonic device 100 can be e.g., polysilicon (refractive index (n)=about 3.7), single-crystal silicon (n=about 3.5) or silicon nitride (n=about 2.01). The outer cladding material 120 can be a suitable dielectric material with a refractive index that is less than the refractive index of the inner core 130, e.g., silicon dioxide (n=about 1.45), aluminum oxide (n=about 1.76) or other metal oxide. In addition, spacers 125 of material matching the refractive index of the outer cladding material 120 may be provided to prevent subsequent etching of the outer cladding material 120 and to provide mechanical support for the device 100. Optical signals would enter the photonic device 100 at the inner core 130 and propagate along at least one optical path p (FIG. 1A).

Inner core 130 may have a thickness from about 150 nm to about 300 nm. Outer cladding material 120 may have a thickness from about 925 nm to about 2 microns. However, this is not limiting. Inner core 130 and outer cladding material 120 may be sized to any dimensions known in the art to enable particular optical characteristics, e.g., to transmit light of a certain wavelength or wavelength range, uses and applications of the device 100.

Possible evanescent coupling due to the proximity of the inner core 130 to the substrate 110 and the similarity in their indexes of refraction increases the potential for loss of optical signal to the substrate 110. As a result, instead of being reflected at the inner core 130-outer cladding material 120 boundary and propagating along the at least one optical path p, light is coupled or otherwise lost to the substrate 110. The method steps discussed below with respect to FIGS. 1C-1F describe how to create a plurality of holes 140 which can form an anti-coupling area 150 in the substrate 110 to help mitigate evanescent coupling and light or signal loss.

Figure 1C:
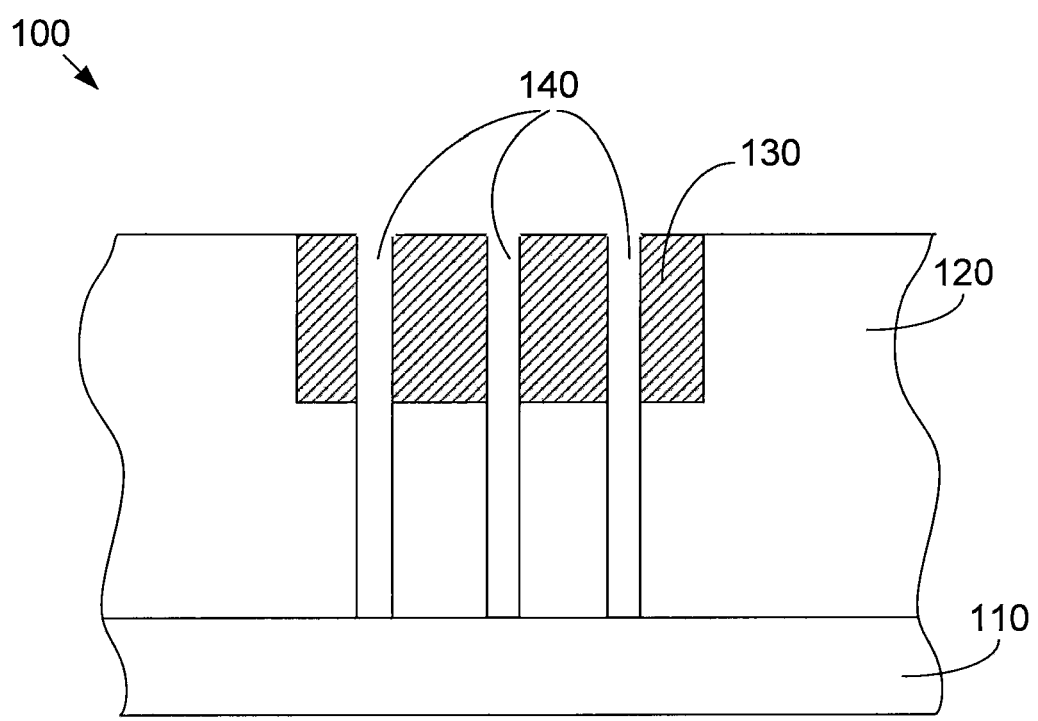
FIG. 1C is a cross-sectional view of the photonic device of FIG. 1B taken along section A-A at a stage of processing subsequent to that of FIG. 1B.

After the outer cladding material 120 and the inner core 130 are formed above the substrate 110, a plurality of holes 140 may be formed in the outer cladding material 120 and the inner core 130, as shown in FIG. 1C. At this stage of processing, portions of the photonic device 100 are removed through patterning and suitable etching to form the holes 140. The holes 140 may extend from the top of the device 100 through the inner core 130 and the cladding layer 120 to an underlying substrate 110. From a top-down perspective, the shape of the holes 140 may be spherical, rectangular, polygonal or other shape.

Figure 1D:
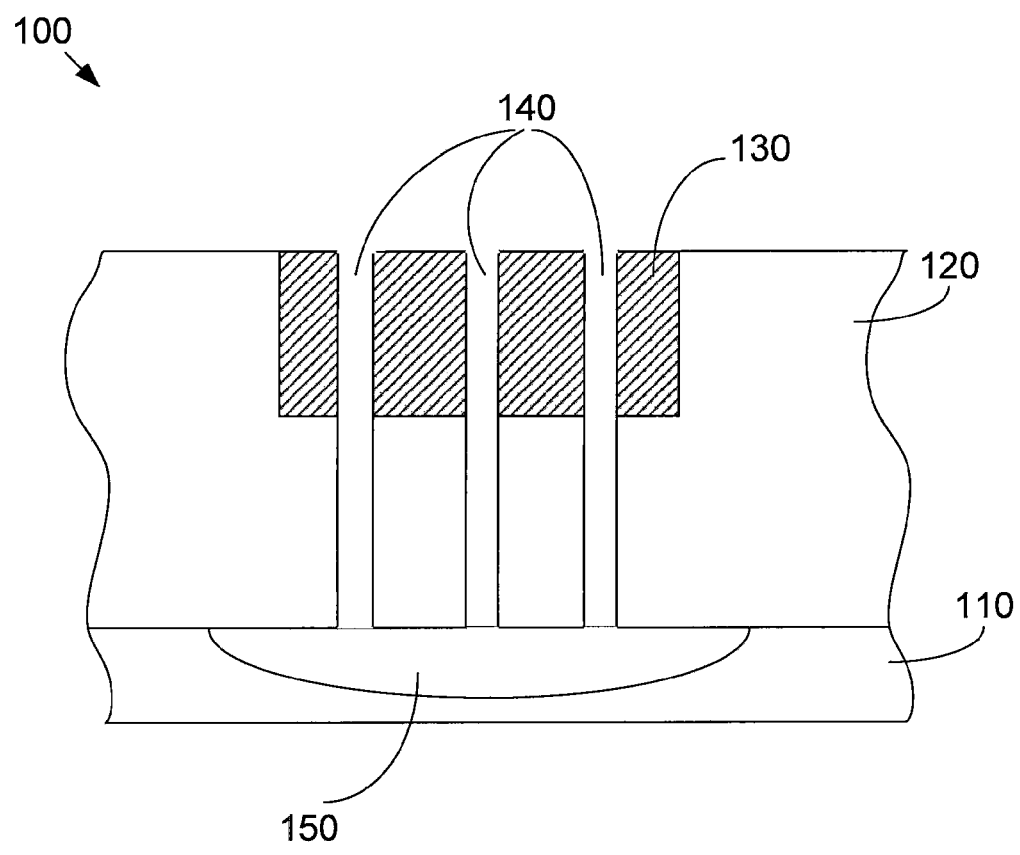
FIG. 1D is a cross-sectional view of the photonic device of FIG. 1C taken along section A-A at a stage of processing subsequent to that of FIG. 1C.
Figure 1E:
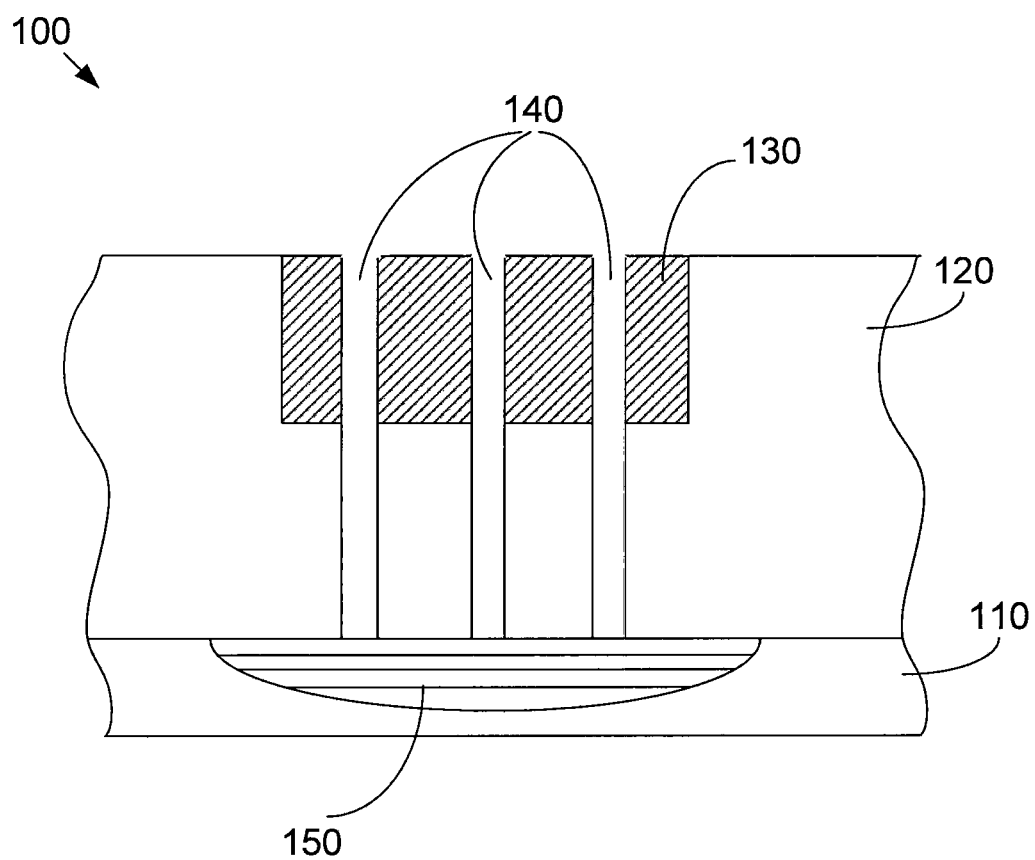
FIG. 1E is a cross-sectional view of the photonic device of FIG. 1D taken along section A-A at a stage of processing subsequent to that of FIG. 1D.

Following the formation of the holes 140, an anti-coupling area 150 can be formed in the substrate 110, as depicted in FIG. 1D. The anti-coupling area 150 extends below at least a portion of the outer cladding material 120 and at least a portion of the inner core 130. The anti-coupling area 150 may be formed through any etching process, e.g., isotropic etching, plasma etching, reactive ion etching, or an etching process used to form the plurality of holes 140 in FIG. 1C. The anti-coupling area 150 may remain "empty," i.e., filled with only air, as in FIG. 1D. Alternatively, as shown in FIG. 1E, at least a portion of the anti-coupling area 150 can be filled with a suitable dielectric material that can be formed using the same or similar materials and techniques used to form the outer cladding material 120, e.g., silicon dioxide, aluminum oxide or other metal oxide. A post-etching heating process, e.g., thermal oxidation process at between about 800° C. and about 1200° C., may also be employed to grow an oxide in the anti-coupling area 150. For example, if substrate 110 is formed of silicon, the anti-coupling area 150 can be filled with a grown silicon dioxide.

Figure 1F:
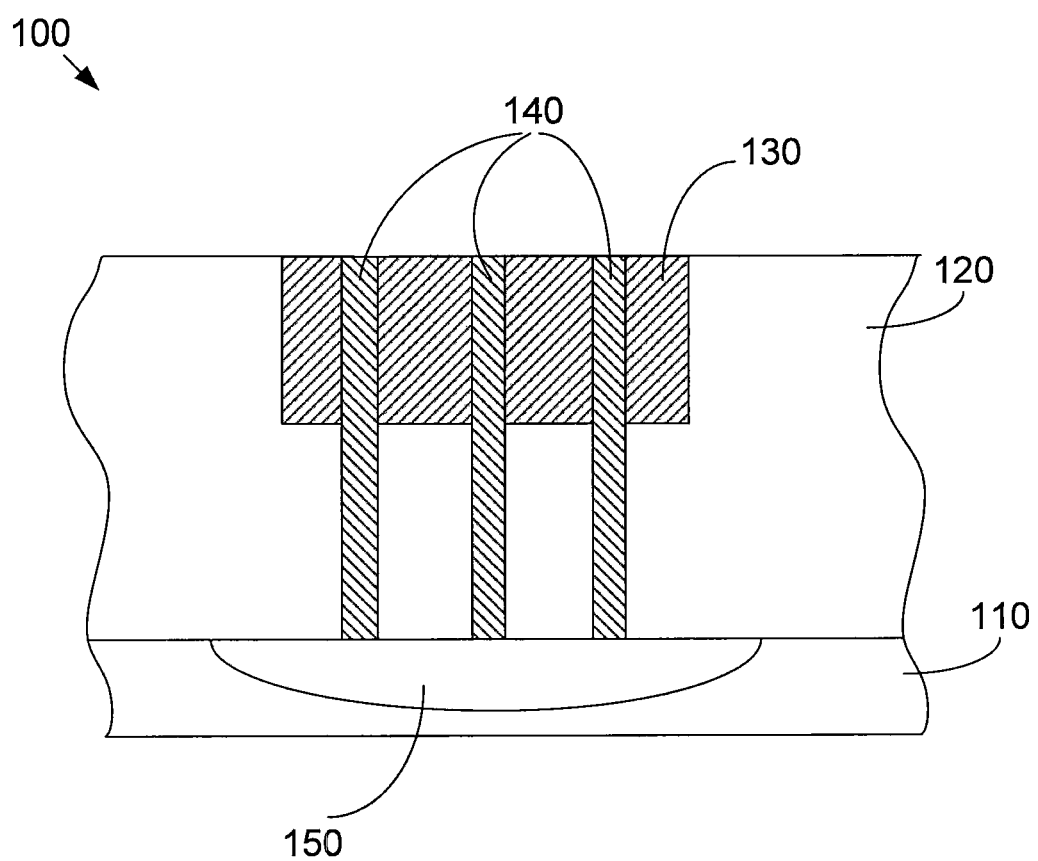
FIG. 1F is a cross-sectional view of the photonic device of FIG. 1E taken along section A-A at a stage of processing subsequent to that of FIG. 1E.

As shown in FIG. 1F, the plurality of holes 140 may be filled with polysilicon (n=about 3.7), single-crystal silicon (n=about 3.5), silicon nitride (n=about 2.01) or any other suitable material having a refractive index greater than the refractive index of the outer cladding material 120. The holes 140 should be optically compatible with the inner core 130 such that the holes 140 will not cause optical leakage from the inner core 130 to the substrate 110. This allows the propagation of an optical signal through the inner core 130 to proceed unaffected by the plurality of holes 140 while the anti-coupling area 150 mitigates coupling between the inner core 130 and the substrate 110.

Accordingly, photonic device 100 comprises a substrate 110; an outer cladding material 120 formed above the substrate 110; an inner core 130 within a portion of the outer cladding material 120; and an anti-coupling area 150 in the substrate 110 extending below at least a portion of the inner core 130 and at least a portion of the outer cladding material 120. In addition, the anti-coupling area 150 can be sufficient to mitigate optical coupling between the inner core 130 and the substrate 110. The inner core 130 comprises one of polysilicon, crystal silicon and silicon nitride. The outer cladding material 120 comprises one of silicon dioxide, aluminum oxide, a metal oxide and a dielectric material.

At least a portion of the anti-coupling area 150 may have a refractive index that is about equal to or less than a refractive index of the outer cladding material. Also, at least a portion of the anti-coupling area 150 can be filled with one of a dielectric material, air, silicon dioxide, aluminum oxide and a metal oxide.

A method of forming photonic device 100 is also provided. The method involves: forming the outer cladding material 120 above the substrate 110; forming the inner core 130 within a portion of the outer cladding material 120; forming holes 140 within the inner core 130 and outer cladding material 120; using the holes 140 to form an anti-coupling area 150 in the substrate 110 extending below at least a portion of the inner core 130 and at least a portion of the outer cladding material 120. The anti-coupling area 150 can be sufficient to mitigate optical coupling between the inner core and the substrate.

The method can also involve filling at least a portion of the anti-coupling area 150 with a material having a refractive index that about equal to or less than the refractive index of the outer cladding material. The anti-coupling area 150 may also be filled with air. The steps can be performed during one of a CMOS process, a damascene process and a dual damascene process.

The plurality of holes can also be filled with various materials to provide a photonic crystal as will now be described.

Figure 2:
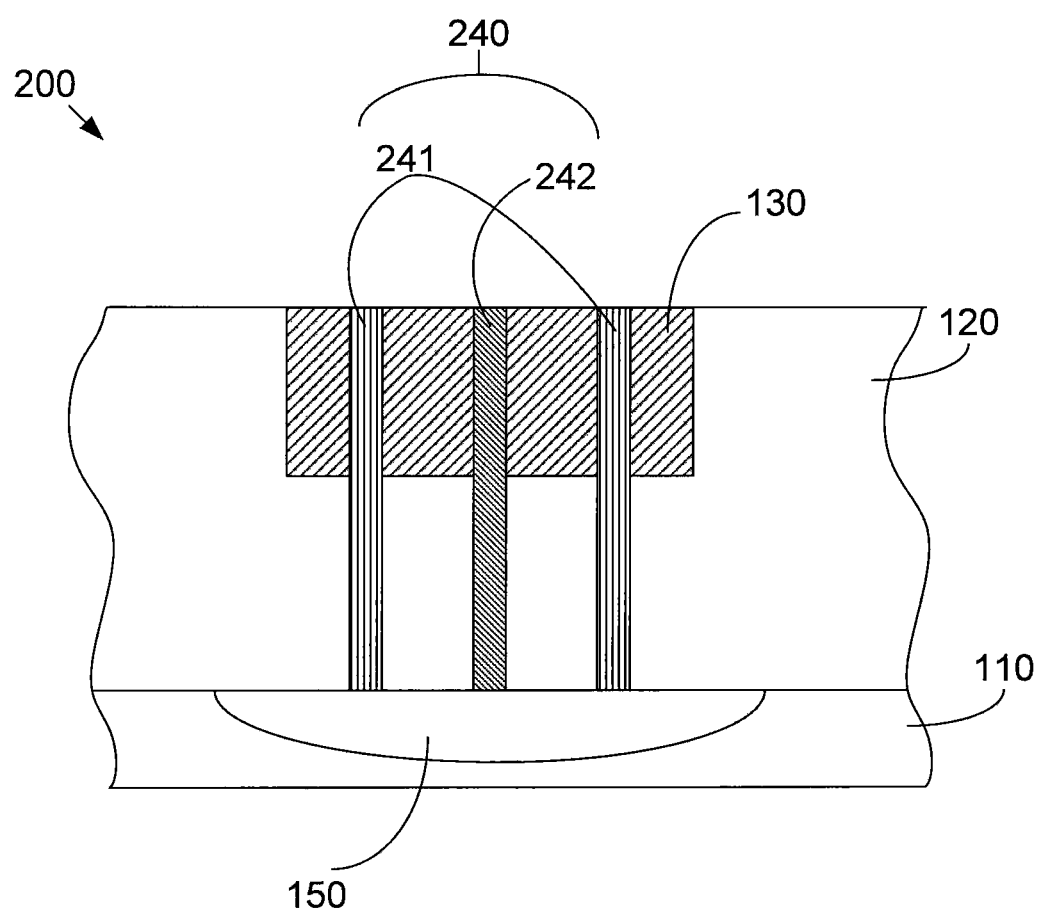
FIG. 2 is a cross-sectional view of another embodiment of a photonic device taken along section A-A.

FIG. 2 illustrates a photonic device 200 according to an embodiment that is similar to the device 100 of FIG. 1F except that at least a first group 241 of the plurality of holes 240 can be filled with a material having a first refractive index that is about equal to or less than the refractive index of the outer cladding material 120. A second group 242 of the plurality of holes 240 can be filled with a material that has a second refractive index that is likewise about equal to or less than that of the outer cladding material 120. The material filling holes 240 can be any of the materials used to form the outer cladding material 120 (FIGS. 1A-1B) or to fill the anti-coupling area 150 (FIG. 1E), e.g., silicon dioxide, aluminum oxide or other metal oxide or dielectric material. As a result, the arrangement and filling of the plurality of holes 240 can periodically alter the index of refraction of the inner core 130. Thus, the inner core 130 forms a photonic crystal with a customizable photonic wavelength bandgap.

Holes of the first group 241 can be filled with the same material or with different materials (with a refractive index that is equal to or less than that of the outer cladding material 120) as holes of the second group 242 to form a photonic crystal. If the first group of holes 241 and the second group of holes 242 are filled with different materials, the respective refractive indices of the materials used should support the desired periodic alteration in the index of refraction in inner core 130 and the optical properties of the device 200.

Figure 3:
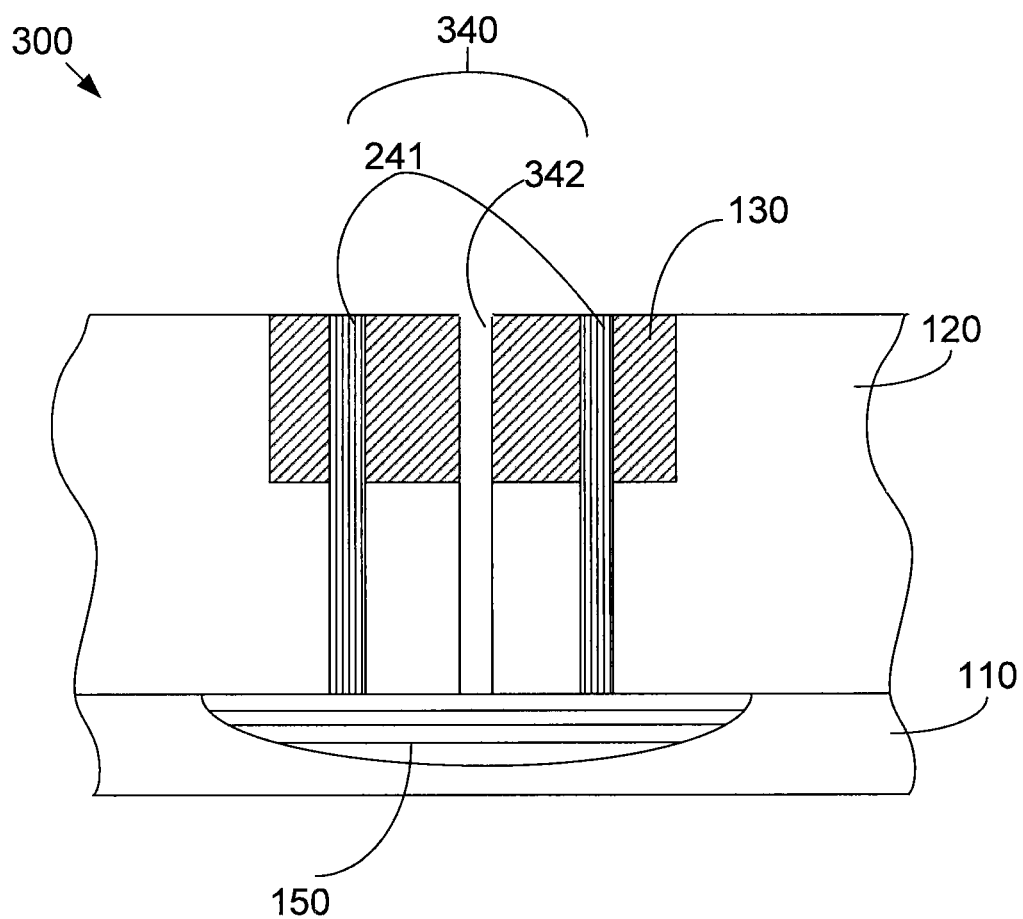
FIG. 3 is a cross-sectional view of another embodiment of a photonic device taken along section A-A.

FIG. 3 illustrates a photonic device 300 according to another embodiment that is similar to the device 200 of FIG. 2 except that that at least the first group 241 and/or the second group 342 of the plurality of holes 340 is filled with air (n=about 1). As described in FIG. 3, the second group 342 of the plurality of holes 340 can be filled with air but this is not limiting.

In either embodiment, the anti-coupling area 150 may be filled with air (as in FIG. 1D) or with a dielectric material (as in FIG. 1E).

The properties and geometry of the elements of the photonic devices 100, 200, 300 may include any properties and geometry known in the art. Photonic device 200, 300 can function as two-dimensional (2D), e.g., holes 240, 340 are periodic in two dimensions to form a wavelength bandgap for all directions and polarizations of propagation in the particular plane of periodicity, or three-dimensional (3D), e.g., holes 240, 340 are periodic in three dimensions to form a complete wavelength bandgap, photonic crystals. The arrangement of the holes 240, 340 and their respective refractive indices, i.e. the filling material used (if any), determines the wavelength bandgap of the photonic device 200, 300.

Figure 4A:
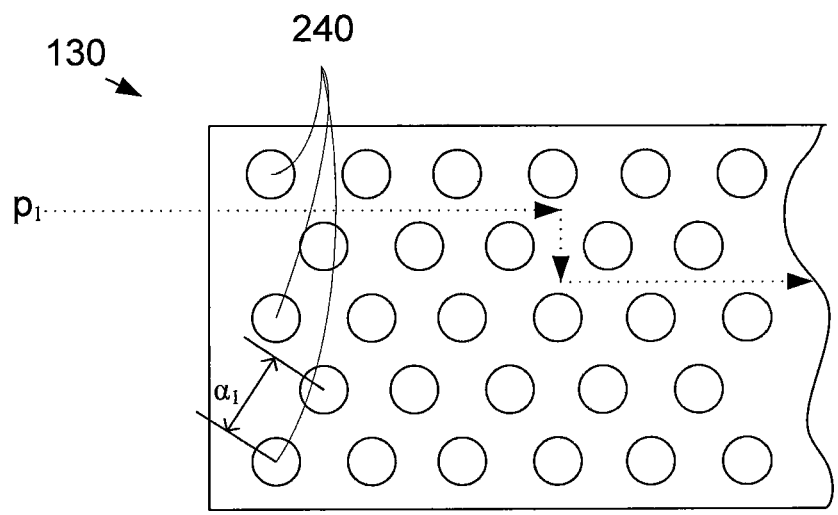
FIG. 4A is a top-down view of the inner core of the photonic device of FIG. 2.
Figure 4B:
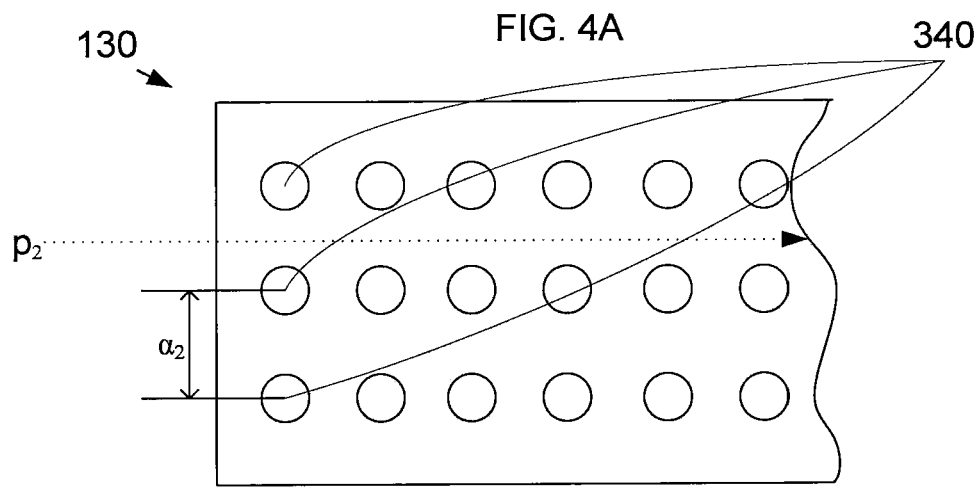
FIG. 4B is a top-down view of the inner core of the photonic device of FIG. 3.

FIGS. 4A-4B illustrate a top-down view of inner core 130 of photonic device 200, 300 respectively showing exemplary arrangements of holes 240, 340 which can be used. Device 200, 300 can function as a 2D or a 3D photonic crystal. FIG. 4A illustrates an exemplary triangular lattice of holes 240 and FIG. 4B illustrates an exemplary rectangular lattice of holes 340, however the arrangements are not so limited. The lattice constant $\alpha_{1,2}$ i.e., period, is the distance from the center of one hole 240, 340 to the center of an adjacent hole 240, 340. To achieve a photonic bandgap for a desired wavelength or wavelength range, a should be a fraction (typically one-half) of the desired wavelength. The radius of holes 240, 340 can be from about $0.20\alpha_{1,2}$ to about $0.48\alpha_{1,2}$, for example, depending on the desired wavelength bandgap range of the device 200, 300. Generally, the wavelength bandgap can be made wider with a greater refractive index contrast between the inner core 130 and the outer cladding material 120. The lower bound of the photonic bandgap wavelength is determined mainly by the smallest a and holes 240, 340 that can be formed. The wavelength and width of the photonic bandgap also depend on the filling ratio, which is the ratio of the volume of the plurality of the holes 240, 340 in the photonic device 200, 300 as compared to the total volume of the photonic device 200, 300. The photonic device 100, 200, 300 may transmit light in one, two or several modes. An optical signal may travel along an optical path $p_2$ or $p_2$, for example. Each mode travels along an optical path p through the inner core 130 with a distinct propagation constant and group velocity. Each mode is described as about the sum of the multiple reflections of a transverse electromagnetic (TEM) wave bouncing inside the inner core 130 in the direction of an optical signal at a certain bounce angle.

The optical paths $p_{1,2}$ of FIGS. 4A-4B are not limiting. The optical properties of device 200, 300 (determined by its geometry and materials) will define the precise optical path p along which a particular optical signal propagates. Devices 200, 300 may receive one or more optical signals which may travel along various optical paths.

3D and 2D photonic crystals and methods of formation are respectively described in U.S. Pat. No. 7,054,532 and U.S. Pat. No. 7,418,161. U.S. Pat. No. 7,054,532 describes additional processing steps needed to form a dielectric lattice, i.e., arrangement of holes 240, 340, that is periodic in a third dimension in order for inner core 130 of device 200, 300 to form a 3D photonic crystal. As further examples of the geometry of the photonic device 200, 300 that can also function as a photonic crystal, Jiao et. al, "Photonic Crystal Device Optimization Without Increasing Fabrication Tolerances: A Mode Demultiplexer Design," Stanford University ("Jiao") has proposed a compact (8.2 microns by 13.3 microns) multi-mode photonic device having a plurality (e.g., thousands) of holes with a radius of about $0.18\alpha$. Another example of the geometry of photonic device 200, 300 can be found in Soljacic et. al, "Nonlinear Photonic Crystal Microdevices for Optical Integration," Optical Society of America, Apr. 15, 2003, Vol. 8, No. 8 ("Soljacic"). Soljacic has proposed a four-port, nonlinear photonic crystal having holes with a radius of $0.2\alpha$. In a further example, Jiang et. al, "80-Micron Interaction Length Silicon Photonic Crystal Waveguide Modulator," Applied Physics Letter 87, 221105 (2005) ("Jiang") has proposed an ultracompact photonic crystal modulator having a lattice constant of 400 nm, a hole diameter of 210 nm, an inner core thickness of 215 nm and an outer cladding material thickness of 2 microns.

Accordingly, device 200, 300 (FIGS. 2, 3) may be substantially identical to device 100, except that a plurality of holes 240, 340 are provided in the inner core 130 extending therethrough from a top surface thereof to form a photonic crystal. At least a first group 241 of the plurality of holes 240, 340 can have a first refractive index that is about equal to or less than a refractive index of the outer cladding material 120. The first group 241 of the plurality of holes 240, 340 may be filled with a dielectric material. The first group 241 of the plurality of holes 240, 340 may be filled with one of silicon dioxide, aluminum oxide and a metal oxide. The first group 241 of the plurality of holes 240, 340 may be filled with air. At least a second group 242, 342 of the plurality of holes 240, 340 can have a second refractive index that is about equal to or less than a refractive index of the outer cladding material 120. The second group 242, 342 of the plurality of holes 240, 340 may be filled with a dielectric material. The second group 242, 342 of the plurality of holes 240, 340 may be filled with one of silicon dioxide, aluminum oxide and a metal oxide. The second group 242, 342 of the plurality of holes 240, 340 may be filled with air. The photonic crystal can be a two-dimensional photonic crystal. The photonic crystal can also be a three-dimensional photonic crystal.

The method of forming device 200, 300 may be substantially identical to the method of forming device 100, except that the method also involves forming a plurality of holes 240, 340 in the inner core 130 extending therethrough from a top surface thereof to form a photonic crystal. The photonic crystal can be a two-dimensional photonic crystal. The photonic crystal can also be a three-dimensional photonic crystal. The method can also involve filling a first group 241 of the plurality of holes 240, 340 with a material having a first refractive index that is about equal to or less than a refractive index of the outer cladding material 120. The method can also involve filling a second group 242, 342 of the plurality of holes 240, 340 with a material having a second refractive index that is about equal to or less than a refractive index of the outer cladding material 120. One of the first group 241 of the plurality of holes 240, 340 and the second group 242, 342 of the plurality of holes 240, 340 can be filled with air.

Figure 5:
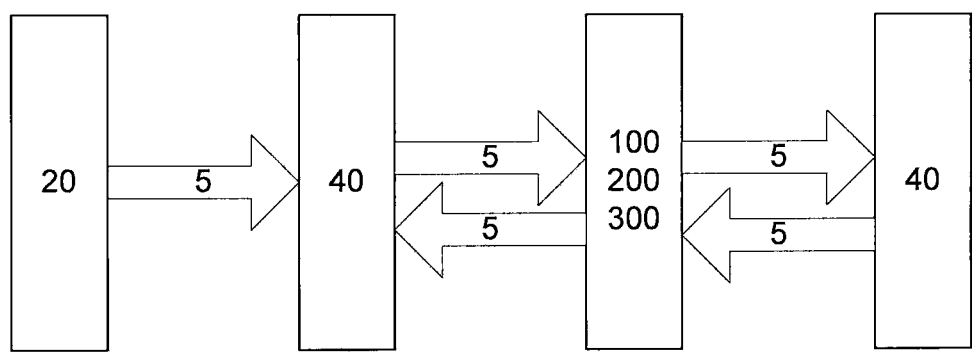
FIG. 5 is a block diagram of an electronic-photonic device having a photonic device constructed in accordance with the various embodiments disclosed herein.

FIG. 5 is a block diagram that describes how at least one photonic device, e.g., 100, 200, 300 (FIGS. 1-4), may be in communication with an on-chip or off-chip emitter 20 and a transceiver 40, and may facilitate propagation of an optical signal 5 in an electronic-photonic device 10. By way of example, the various embodiments of the at least one photonic device 100, 200, 300 may operate by receiving an optical signal 5 from an on-chip or off-chip emitter 20, e.g., optical emitter, light emitting diode, laser diode or other emitter. The optical signal 5 may then be transmitted through the at least one photonic device 100, 200, 300 or a series of photonic devices. From there, the optical signal 5 may travel to a modulator and/or a detector (not shown), which may be integrated as a transceiver 40. Transceiver 40 may be positioned at one or both ends of the at least one photonic device 100, 200, 300. The transceiver 40 may be configured to send and/or receive the optical signal 5, as shown in FIG. 5. A transceiver 40 may also convert the optical signal 5 back into an electrical signal to drive another element of the electronic-photonic device, for example. If more than one photonic device 100, 200, 300 is provided in series, for example, the optical signal 5 may also travel between the photonic devices 100, 200, 300.

The plurality of holes 140, 240, 340 may include any number, e.g., thousands, of holes that supports the desired optical and/or electrical properties of the device 100, 200, 300.

A system is provided according to the various embodiments, the system comprising: an emitter 20 configured to transmit an optical signal 5; and at least one photonic device 100, 200, 300 configured to receive the optical signal 5 from the emitter 20 comprising: a substrate 110; an outer cladding material 120 formed above the substrate 110; an inner core 130 within a portion of the outer cladding material 110; and an anti-coupling area 150 in the substrate 110 extending below at least a portion of the inner core 130 and at least a portion of the outer cladding material 120. The anti-coupling area 150 can be sufficient to mitigate optical coupling between the inner core 130 and the substrate 110.

The system may include a transceiver 40 positioned at one or both ends of the at least one photonic device 100, 200, 300 configured to send and receive the optical signal from the at least one photonic device 100, 200, 300. A plurality of holes 240, 340 can be provided in the inner core 130 extending therethrough from a top surface thereof to form a photonic crystal. The photonic crystal may be a two-dimensional photonic crystal. The photonic crystal may be a three-dimensional photonic crystal. At least a portion of the anti-coupling area 150 may be filled with a material having a refractive index that is about equal to or less than a refractive index of the outer cladding material 120. The anti-coupling area 150 may be filled with air. At least a first group 241 of the plurality of holes 240, 340 may have a first refractive index that is about equal to or less than a refractive index of the outer cladding material 120. The first group 241 of the plurality of holes 240, 340 may be filled with a dielectric material. The first group 241 of the plurality of holes 240, 340 may be filled with one of silicon dioxide, aluminum oxide, and a metal oxide. The first group 241 of the plurality of holes 240, 340 may be filled with air. At least a second group 242, 342 of the plurality of holes 240, 340 may have a second refractive index that is about equal to or less than a refractive index of the outer cladding material 120. The inner core 130 comprises one of polysilicon, single-crystal silicon and silicon nitride. The outer cladding material 120 comprises silicon dioxide.

While disclosed embodiments have been described in detail, it should be readily understood that the invention is not limited to the disclosed embodiments. Rather, the disclosed embodiments can be modified to incorporate any number of variations, alterations, substitutions or equivalent arrangements not heretofore described.

What is claimed as new and desired to be protected by Letters Patent of the United States is:

1. A photonic device comprising:
   a substrate;
   an outer cladding material formed above the substrate;
   an inner core within a portion of the outer cladding material, the inner core and the outer cladding material having a common top surface; and
   an anti-coupling area in the substrate extending below at least a portion of the inner core and at least a portion of the outer cladding material,
   wherein the anti-coupling area is sufficient to mitigate optical coupling between the inner core and the substrate, and
   wherein the inner core has a plurality of holes extending therethrough from a top surface thereof to the anti-coupling area to form a photonic crystal.

2. The photonic device of claim 1, wherein at least a portion of the anti-coupling area has a refractive index that is about equal to or less than a refractive index of the outer cladding material.

3. The photonic device of claim 1, wherein at least a portion of the anti-coupling area is filled with a dielectric material.

4. The photonic device of claim 1, wherein at least a portion of the anti-coupling area is filled with one of silicon dioxide, aluminum oxide and a metal oxide.

5. The photonic device of claim 1, wherein at least a portion of the anti-coupling area is filled with air.

6. The photonic device of claim 1, wherein at least a first group of the plurality of holes has a first refractive index that is about equal to or less than a refractive index of the outer cladding material.

7. The photonic device of claim 6, wherein the first group of the plurality of holes is filled with a dielectric material.

8. The photonic device of claim 6, wherein the first group of the plurality of holes is filled with one of silicon dioxide, aluminum oxide and a metal oxide.

9. The photonic device of claim 6, wherein the first group of the plurality of holes is filled with air.

10. The photonic device of claim 6, wherein at least a second group of the plurality of holes has a second refractive index that is about equal to or less than a refractive index of the outer cladding material, and wherein the first refractive index and the second refractive index are different.

11. The photonic device of claim 10, wherein the second group of the plurality of holes is filled with a dielectric material.

12. The photonic device of claim 10, wherein the second group of the plurality of holes is filled with one of silicon dioxide, aluminum oxide and a metal oxide.

13. The photonic device of claim 10, wherein the second group of the plurality of holes is filled with air.

14. The photonic device of claim 1, wherein the inner core comprises one of polysilicon, single-crystal silicon and silicon nitride.

15. The photonic device of claim 1, wherein the outer cladding material comprises a dielectric material.

16. The photonic device of claim 1, wherein the outer cladding material comprises one of silicon dioxide, aluminum oxide and a metal oxide.

17. The photonic device of claim 1, wherein the photonic crystal is a two-dimensional photonic crystal.

18. The photonic device of claim 10, wherein the photonic crystal is a three-dimensional photonic crystal.

19. A system comprising:
    an emitter configured to transmit an optical signal; and
    at least one photonic device configured to receive the optical signal from the emitter comprising:
    a substrate;
    an outer cladding material formed above the substrate;
    an inner core within a portion of the outer cladding material, the inner core and the outer cladding material having a common top surface;
    an anti-coupling area in the substrate extending below at least a portion of the inner core and at least a portion of the outer cladding material,
    wherein the anti-coupling area is sufficient to mitigate optical coupling between the inner core and the substrate, and
    wherein the inner core has a plurality of holes extending therethrough from a top surface thereof to the anti-coupling area to form a photonic crystal.

20. The system of claim 19, further comprising a transceiver positioned at one or both ends of the at least one photonic device configured to send and receive the optical signal from the at least one photonic device.

21. The system of claim 19, wherein the photonic crystal is a two-dimensional photonic crystal.

22. The system of claim 19, wherein at least a portion of the anti-coupling area is filled with a material having a refractive index that is about equal to or less than a refractive index of the outer cladding material.

23. The system of claim 19, wherein the anti-coupling area is filled with air.

24. The system of claim 19, wherein at least a first group of the plurality of holes has a first refractive index that is about equal to or less than a refractive index of the outer cladding material.

25. The system of claim 24, wherein the first group of the plurality of holes is filled with a dielectric material.

26. The system of claim 24, wherein the first group of the plurality of holes is filled with one of silicon dioxide, aluminum oxide and a metal oxide.

27. The system of claim 24, wherein the first group of the plurality of holes is filled with air.

28. The system of claim 24, wherein at least a second group of the plurality of holes has a second refractive index that is about equal to or less than a refractive index of the outer cladding material, and wherein the first refractive index and the second refractive index are different.

29. The system of claim 28, wherein the photonic crystal is a three-dimensional photonic crystal.

30. The system of claim 19, wherein the inner core comprises one of polysilicon, single-crystal silicon and silicon nitride.

31. The system of claim 19, wherein the outer cladding material comprises silicon dioxide.

32. A method of forming a photonic device, the method comprising:
    forming an outer cladding material above a substrate;
    forming an inner core within a portion of the outer cladding material, the inner core and the outer cladding material having a common top surface; and
    forming an anti-coupling area in the substrate extending below at least a portion of the inner core and at least a portion of the outer cladding material; and
    forming a plurality of holes in the inner core extending therethrough from a top surface thereof to the anti-coupling area to form a photonic crystal,
    wherein the anti-coupling area is sufficient to mitigate optical coupling between the inner core and the substrate.

33. The method of claim 32, further comprising:
    filling at least a portion of the anti-coupling area with a material having a refractive index that is about equal to or less than a refractive index of the outer cladding material.

34. The method of claim 32, wherein the anti-coupling area is filled with air.

35. The method of claim 32, wherein the method is performed during one of a CMOS process, a damascene process and a dual damascene process.

36. The method of claim 32, wherein the photonic crystal is one of a two-dimensional photonic crystal and a three-dimensional photonic crystal.

37. The method of claim 32, further comprising:
    filling a first group of the plurality of holes with a material having a first refractive index that is about equal to or less than a refractive index of the outer cladding material.

38. The method of claim 37, further comprising:
    filling a second group of the plurality of holes with a material having a second refractive index that is about equal to or less than a refractive index of the outer cladding material.

39. The method of claim 32, wherein one of a first group of the plurality of holes and a second group of the plurality of holes is filled with air.

* * * * *